United States Patent
Cohn et al.

(10) Patent No.: US 7,093,213 B2
(45) Date of Patent: Aug. 15, 2006

(54) METHOD FOR DESIGNING AN INTEGRATED CIRCUIT DEFECT MONITOR

(75) Inventors: John M. Cohn, Richmond, VT (US); Leah M. P. Pastel, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 10/710,940

(22) Filed: Aug. 13, 2004

(65) Prior Publication Data

US 2006/0036976 A1   Feb. 16, 2006

(51) Int. Cl.
*G06F 17/50* (2006.01)
*G01R 31/28* (2006.01)

(52) U.S. Cl. .............................. 716/4; 716/18; 714/726
(58) Field of Classification Search ................ 716/4–6, 716/8, 12–14, 18; 714/726–727
See application file for complete search history.

(56) References Cited

U.S. PATENT DOCUMENTS

| | | | | |
|---|---|---|---|---|
| 5,703,789 A | * | 12/1997 | Beausang et al. | ............... 716/4 |
| 6,708,317 B1 | * | 3/2004 | Grisenthwaite | ................ 716/4 |
| 6,836,877 B1 | * | 12/2004 | Dupenloup | .................. 716/18 |

\* cited by examiner

*Primary Examiner*—Paul Dinh
(74) *Attorney, Agent, or Firm*—Schmeiser, Olsen & Watts; Richard M. Kotulak

(57) ABSTRACT

A method and system for designing a test structure. The method including: defining and placing test circuit pins in an integrated circuit design; routing one or more fat wires, each fat wire routed between a set of the test circuit pins; processing each fat wire into a continuous wire and one or more corresponding wire segments adjacent to the continuous wire, the continuous wire separated from the one or more corresponding wire segments by a space; and connecting the continuous wire and the one or more wire segments to circuit elements of a defect monitor scan chain, the circuit elements previously inserted into the integrated circuit design.

20 Claims, 12 Drawing Sheets

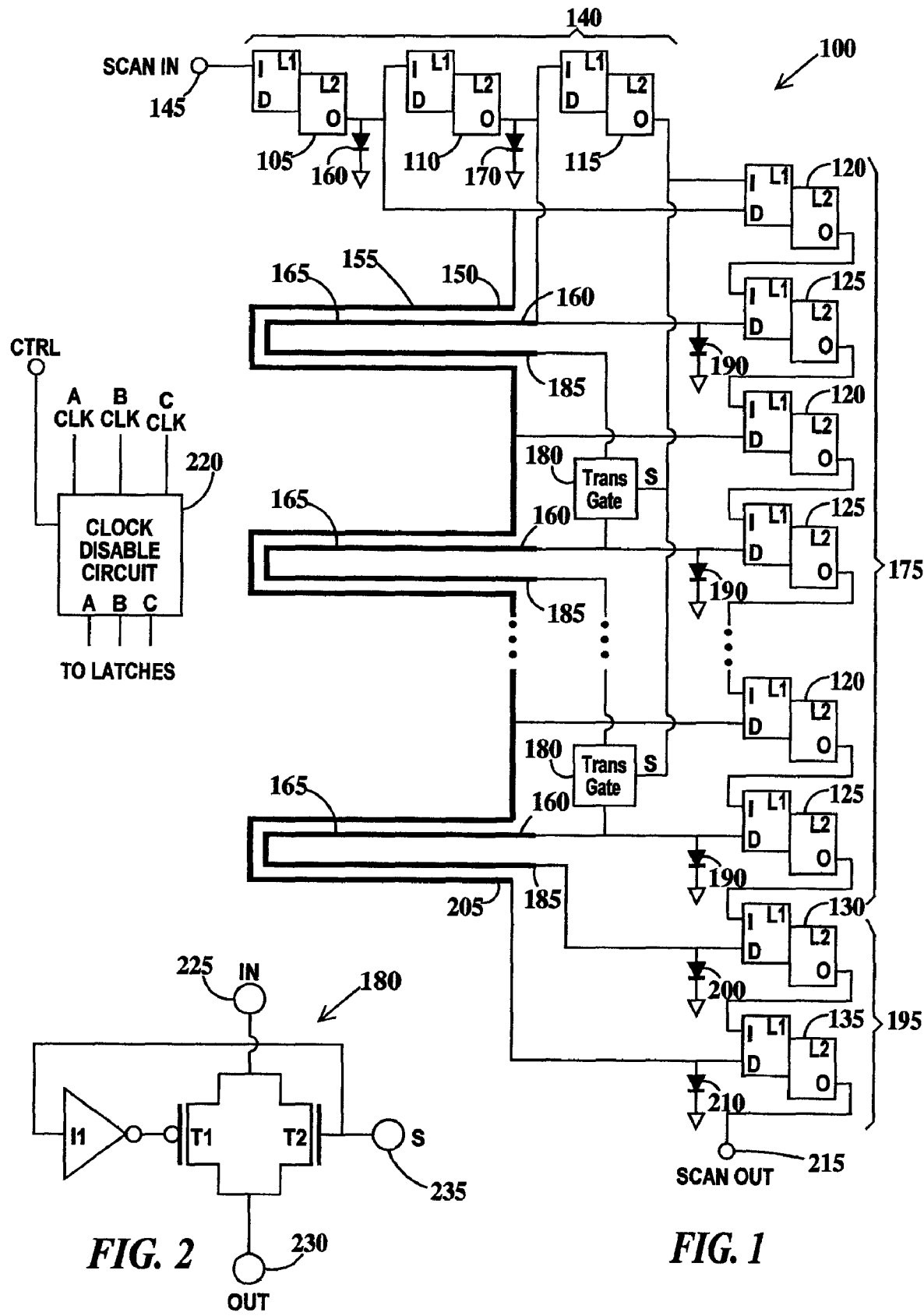
*FIG. 2*  *FIG. 1*

US 7,093,213 B2

METHOD FOR DESIGNING AN INTEGRATED CIRCUIT DEFECT MONITOR

CROSS REFERENCE TO RELATED APPLICATIONS

This Application is related to U.S. patent application Ser. No. 10/873,012 entitled "Circuit And Method For Monitoring Defects" filed on Jun. 21, 2004, which is hereby incorporated by reference in its entirety.

BACKGROUND OF INVENTION

1. Field of the Invention

The present invention relates to the field of defect monitoring; more specifically, it relates to a method of inserting a test circuit and corresponding shorts/opens defect monitoring structures into an integrated circuit design.

2. Background of the Invention

Yield management in integrated circuit manufacturing is an ongoing concern and is especially important as new technologies, tools and processes are developed and introduced into manufacturing. As integrated circuits have become more complex, yield learning has become more difficult and defect monitor circuits and structures have become increasing more difficult to insert into integrated circuit chips, especially application specific integrated circuit (ASIC) chips where chip area available for defect monitoring may be at a premium and the functional design may be generated separately from defect monitor circuits and structures. Further, traditional placement sites, such as kerfs, often require too much area (and are thus expensive) for sufficiently large monitor structures. Therefore, there is a need for a method to insert defect monitoring circuits, and defect monitoring structures into integrated circuit designs.

SUMMARY OF INVENTION

A first aspect of the present invention is a method of designing a test structure, comprising: defining and placing test circuit pins in an integrated circuit design; routing one or more fat wires, each fat wire routed between a set of the test circuit pins; processing each fat wire into a continuous wire and one or more corresponding wire segments adjacent to the continuous wire, the continuous wire separated from the one or more corresponding wire segments by a space; and connecting the continuous wire and the one or more wire segments to circuit elements of a defect monitor scan chain, the circuit elements previously inserted into the integrated circuit design.

A second aspect of the present invention is a computer system comprising a processor, an address/data bus coupled to the processor, and a computer-readable memory unit coupled to the processor, the memory unit containing instructions that when executed by the processor implement a method for designing a test structure, the method comprising the computer implemented steps of: placing test circuit pins in an integrated circuit design; routing one or more fat wires, each fat wire routed between a set of the test circuit pins; processing each fat wire into a continuous wire and one or more corresponding wire segments adjacent to the continuous wire, the continuous wire separated from the one or more corresponding wire segments by a space; and connecting the continuous wire and the one or more wire segments to circuit elements of a defect monitor scan chain, the circuit elements previously inserted into the integrated circuit design.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 1 is an exemplary circuit and structure for monitoring defects that may be inserted in an integrated circuit design using the method of the present invention;

FIG. 2 is a schematic diagram of an exemplary transmission gate;

DETAILED DESCRIPTION

Figure 3:
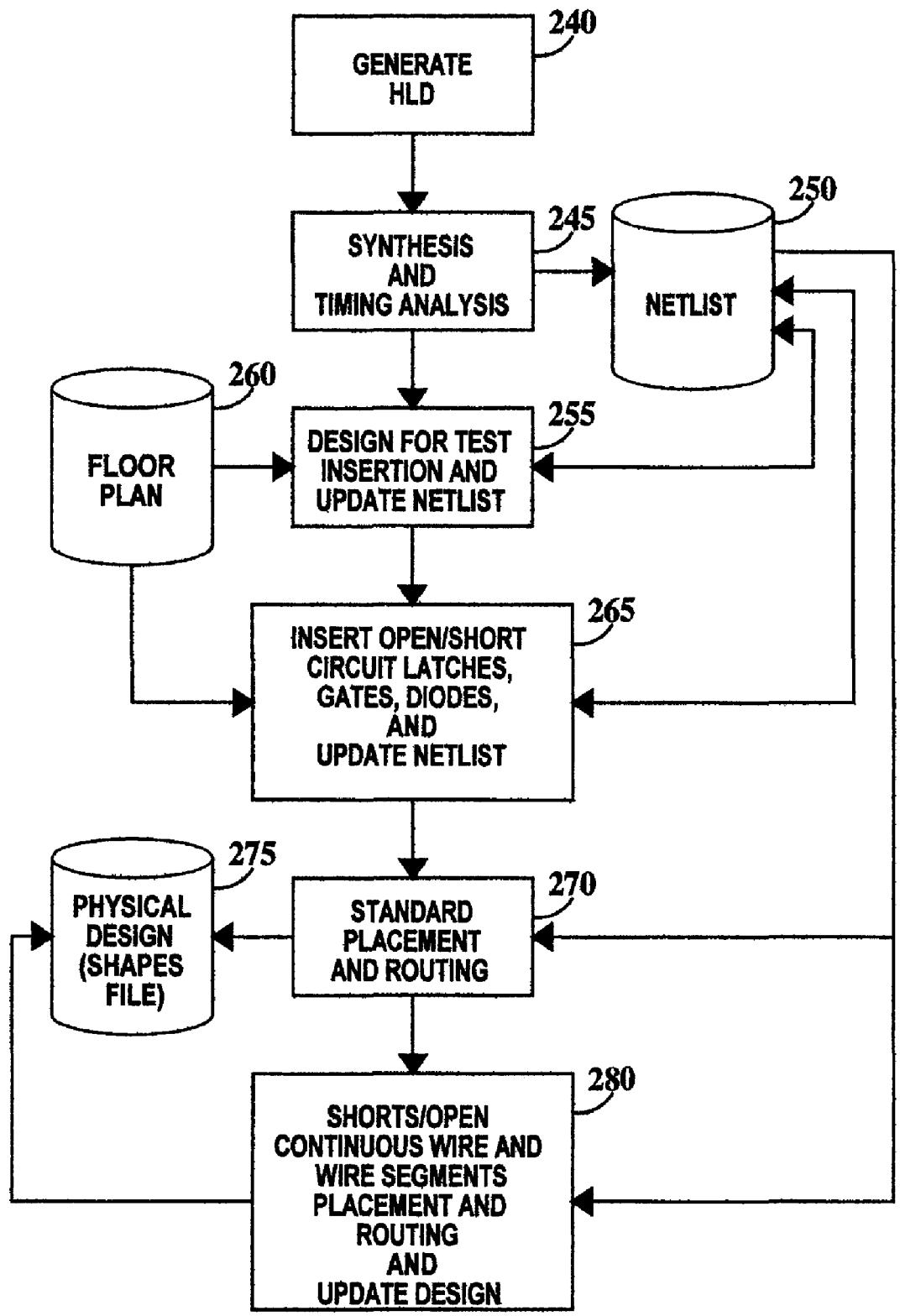
FIG. 3 is an overall flowchart of the method of inserting a shorts/opens defect monitor circuit and structure into an integrated circuit design according to the present invention.

In the integrated circuit design methodology, circuit elements, including pins are inserted and placed into integrated circuit designs. Insertion is defined as adding the circuit element into the list of elements making up the circuit design and placement is defined as locating the circuit elements relative to the integrated circuit layout or floor plan. Depending upon the software and operating mode used, insertion and placement may be two different operations which may be performed together or at different times or a single operation. Whenever the term placement of an element is used it should be understood that insertion of that element has also occurred.

FIG. 1 is an exemplary circuit and structure for monitoring defects that may be inserted in a an integrated circuit design using the method of the present invention. The circuit illustrated in FIG. 1 monitors defects that can cause opens or shorts between conductive power and/or signal wires of an integrated circuit. These wires may be metal wires contained in inter-level dielectric layers fabricated during back-end-of-line (BEOL) processes or wires fabricated during front-end-of-line (FEOL) processing, such as polysilicon wires often used as the gates and gate inter-connection wires of field-effect transistors (FETs).

In FIG. 1, a shorts/opens defect monitor circuit 100 includes a scan chain made up of a first setup latch 105, a second setup latch 110, a third setup latch 115, a set of first net latches 120, a set of second net latches 125, a next to last latch 130 and a last latch 135. Latches 105, 110, 115, 120 and 125 are illustrated in FIG. 1 (and FIGS. 3 and 4) as L1/L2 latches, but many other latch types that are well known in the art may be substituted for L1/L2 latches. L1/L2 latches were chosen in order to allow a detailed explanation of how shorts/opens defect monitor circuit 100 operates. Each of latches 105, 110, 115, 120, 125, 130 and 135 have an input port (I), a data port (D) and an output port (O). In addition, each of latches 105, 110, 115, 120, 125, 130 and 135 have three clock ports, A, B and C not illustrated. A CLK A signal on a latch's A port allows a signal at the input port to be latched by the L1 portion of the latch. The CLK A signal is known as the scan clock. A CLK B signal on a latch's B port allows data to be shifted from the L1 portion to the L2 portion of the latch. The CLK B signal is known as the shift clock. A CLK C signal on a latch's C port allows a signal at a latch's data port to be latched by the L1 portion of the latch. The CLK C signal is known as the data clock.

Latches 105, 110 and 115 are coupled in series into a first scan chain segment 140. The input port of first setup latch 105 is coupled to a scan in node 145. Note, scan in node 145, may be an actual chip scan in pad or the input of first setup latch 105 may be coupled to the output pin of a latch of a functional and parametric test scan chain (see FIG. 3). The output port of first setup latch 105 is connected to a first end 150 of a nominally continuous wire 155, the input port of second setup latch 110 and coupled to ground through a diode 160. Nominally continuous wire 155 is designed to be electrically continuous without intervening active circuit elements. Segments of nominally continuous wire 155 may be interconnected by other wires or to other wires through vias a described infra. Nominally continuous wire 155 may be broken in one or more places by defects. The output port of second setup latch 110 is connected to a first end 160 of the first segment of a set of sequential wire segments 165, the input port of third setup latch 115 and coupled to ground through a diode 170. The output port of third setup latch 115 is connected to the input port of the initial latch (which is a first net latch 120) in a second scan chain segment 175 and the switch (S) input of each of transmission gates 180.

The shorts/opens defect monitor structure of defect monitor circuit 100 is made up of nominally continuous wire 155 and wire segments 165 that run parallel to and adjacent to nominally continuous wire 155 for at least a portion of the length of continuous wire 155 and that has been broken at several points to create multiple wire segments 165. Each transmission gate 180 is connected between second ends 185 and first ends 160 of different and immediately following wire segments 165. Thus transmission gates can connect all wire segments 160 into an electrically continuous wire for opens testing and leave each wire segment 165 electrically isolated from each other for shorts testing as described infra.

Second scan chain segment 175 comprises first net latches 120 and second net latches 125 coupled in series in alternating sequence, the initial latch in second scan chain segment 175 being a first net latch 120 and the last latch in second scan chain segment 175 being a second net latch 125. The output port of each first net latch 120 is connected to the input port of an immediately following second net latch 125. The output port of each second net latch 125 is connected to the input port of an immediately following first net latch 120. The data port of each second net latch 125 is connected to first end 160 of a corresponding and different wire segment 165 and also coupled to ground through a diode 190. In one example diode 190 is a floating gate diode. The data port of each first net latch 120 is connected to a point on nominally continuous wire 155. The data port of the initial first net latch 120 is connected to first end 150 of nominally continuous wires 155. Data ports of subsequent first net latches 120 are electrically connected to nominally continuous wire 155 at points physically located between adjacent wire segments 165.

A third scan chain segment 195 includes next to last latch 130 and last latch 135. The input port of next to last latch 130 is coupled to the output port of the last second net latch 125 of second scan chain segment 175. The data port of next to last latch 130 is connected to second end 185 of the last segment of the set of sequential wire segments 165 and coupled to ground through a diode 200. The output port of next to last latch 130 is coupled to the input port of last latch 135. The data port of last latch 135 is connected to a second end 205 of nominally continuous wire 155 and coupled to ground through a diode 210. The output port of last latch 135 is coupled to a scan out node 215. Note, scan out node 215 may be an actual chip scan out pad or the output of last latch 215 may be coupled to the input pin of a latch of a functional and parametric test scan chain (see FIG. 3).

Diodes 190, 200 and 210 may be replaced by devices such as transistors, pass gates, transmission gates or other switching devices or combinations thereof as long as the latch coupled to the device can overdrive the device.

Defect monitor circuit 100 further includes an optional clock disconnect circuit 220 which will couple the clock inputs of latches 105, 110, 115, 120, 125, 130 and 135 to the off states of the A CLK, B CLK and C CLK signals. Normally the off state of the A CLK, B CLK and C CLK signals is low which may or may not be circuit or chip ground. The off state of the A CLK, B CLK and C CLK signals may or may not be the same in either magnitude or polarity.

The combination of alternating first net latches 120 being connected to points on nominally continuous wire 155 physically located on different sides of wire segments 165 and alternating second net latches 125 being connected to different wire segments imparts a granularity to the data scanned out of the scan chain comprised of first, second and third scan chain segments 135, 175 and 195. This granularity allows determination of the location of defect causing a short or open to the physical area around a single wire segment and thus makes the task of failure analysis much easier.

While a polarity of VDD high and ground low has be assumed in the description of defect monitor circuit 100, the polarity may be reversed with VSS low and ground high. It should be noted that second net latches 125 are always coupled to wire segments 165 and first net latches 120 are always coupled to nominally continuous wire 155. Since first setup latch 105 and last latch 135 are coupled to nominally continuous wire 155, first net latches 120, first setup latch 105 and last latch 135 may be considered to belong to a first set of latches. Since second setup latch 110 and next to last latch 130 are coupled to wire segments 165, second net latches 125, second setup latch 110 and next to last latch 130 may be considered to belong to a second set of latches.

FIG. 2 is a schematic diagram of transmission gate 180 of FIG. 1. In FIG. 2 the sources/drains of a PFET T1 and of an NFET T2 are connected to an input pin 225 and second source/drains of PFET T1 and NFET T2 are connected to an output pin 230. The gate of NFET T2 is connected to a switch pin 235 and to an input of an inverter 11. The output of inverter 11 is coupled to the gate of PFET T1. Transmission gates are used in the present invention since transmission gates will pass all of the voltage level of signal applied to input pin 225 without dropping the voltage level by $V_t$ (threshold voltage) when passing a logical 0 through a PFET or a logical 1 through an NFET. Though pass gates may be substituted, they would not be as efficient and the latch would be more prone to not latching small voltage level shifts caused by high resistance shorts or opens.

The design of defect monitor circuit 100 includes three distinct portions. The first portion is the scan chain portion which comprises circuit elements such as latches 105, 110, 115, 120, 125, 130 and 135, transmission gates 180 diodes 160, 170, 190, 200 and 210. The second portion is the shorts/opens defect monitor structure portion which comprises nominally continuous conductive line 155 and wire segments 165. The third portion comprises and additional wires for interconnecting the first two portions. The present invention provides a methodology for designing both the scan chain portion and the shorts/opens defect monitor structure portion.

Defect monitor circuit 100 is an example of a (level sensitive scan design) LSSD circuit. Other types of scan circuits such as Mux (multiplexer) Scan Chain designs may also be designed using the present invention.

FIG. 3 is an overall flowchart of the method of inserting a shorts/opens defect monitor circuit and structure into an integrated circuit design according to the present invention. In step 240, a high level design (HLD) for an integrated circuit chip is generated. A HLD is essentially a description of the circuit functions and specifications of the integrated circuit chip.

In step 245, synthesis and timing analysis is performed on the HLD to generate a netlist 250, which is essentially an electrical schematic description of the integrated circuit chip design. Synthesis is performed using a computer running any number of design software packages well known in the art such as Design Complier™ by Synopsys, Inc., Mountain View, Calif. Generally the synthesis program selects circuit elements from a circuit design library which may include such design elements such as logic gates, latches, functional circuits such as phase lock loop clock generators and serial link I/Os, and macro circuits such as embedded memory. Timing analysis is also performed using a computer running any number of design software packages well known in the art such as Prime Time™ by Synopsys, Inc., Mountain View, Calif. Often several loops of synthesis and timing analysis are performed before an acceptable design is realized.

In step 255, a design for test insertion is performed using netlist 250 and optionally, a floor plan 260. Design for test insertion, includes inserting (adding) LSSD scan chains (or other types of scan chains such a multiplexer or MUX scan chains) into the integrated circuit chip design. Floor plan 260 may be generated from the HLD or netlist 250 or both. Floor plan 260 indicates the allocation of various circuit areas (blocks) of an integrated circuit chip to given circuit functions or macros. Design for test insertion is also performed using a computer running any number of design software packages well known in the art such as Test Encounter™ by Cadence Design Systems, Inc. in San Jose, Calif. Step 255 is not strictly necessary for the practice of the present invention, but allows integration of the shorts/opens defect monitor circuit of the present invention into integrated circuits designs already using scan chains for functional and parametric testing of the fabricated integrated circuit. Netlist 250 is then updated.

In step 265, the latches, gates, diodes, multiplexers, etc. for the shorts/opens defect monitor circuit are inserted into the integrated circuit chip design using netlist 250 and optionally, floor plan 260. Netlist 250 is then updated. Step 265 is illustrated in more detail in FIG. 4 and described infra. The same software package used in step 255 may be used in step 265.

In step 270, standard placement and routing of all elements in netlist 260 is performed and a physical design (shapes) file 275 is generated. Placement and routing place each circuit element in a physical location on the integrated circuit floor plan and routing runs wire shapes to interconnect the circuit elements. Physical design file 275 may be later post-processed to generate design files used to fabricate the photolithography masks required to fabricate the integrated circuit chip. Placement and routing is also performed using a computer running any number of design software packages well known in the art such as Chip Encounter™ by Cadence Design Systems, Inc. in San Jose, Calif.

In step 280, nominally continuous wire 155 and wire segments 165 (see FIG. 1) are then routed using the same software tool as used in step 270. Step 280 is illustrated in more detail in FIG. 5 and described infra.

Because shorts/opens defect monitor latches and corresponding transmission gates and diodes, multiplexers, etc (depending on the scan chain methodology) are placed after functional elements and functional and parametric testing scan chain elements, otherwise unused chip area is utilized. Likewise, since wire routing for the shorts/open monitor structure is routed after functional wiring and functional and parametric testing scan chain wiring, otherwise unused chip area is utilized for the actual shorts/opens defect structures.

Figure 4:
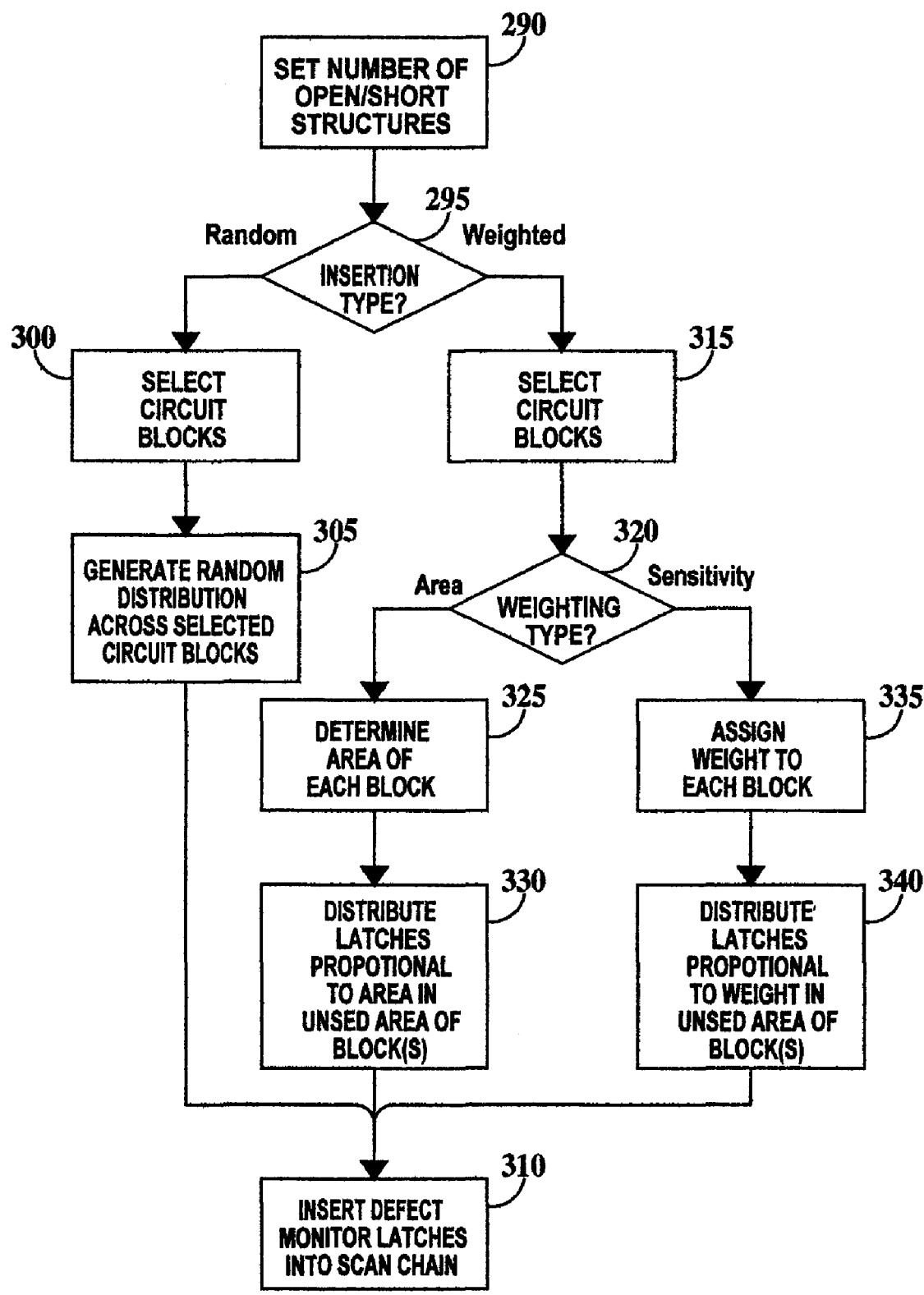
FIG. 4 is a detailed flowchart of step 265 of FIG. 3.

FIG. 4 is a detailed flowchart of step 265 of FIG. 3. In step 290, the number of shorts/opens defect monitor structures is set. This number is the number of wire segments 165 (see FIG. 1) that will be included in the final design and thus sets the number of latches, pass gates, diodes, multiplexers and other circuit elements that will need to be inserted into the integrated circuit chip design. All structures need not be the same, for example multiple different wire width and wire spacing structures on multiple different wiring levels may be used.

In step 295, it is determined if the insertion type is to be random or weighted. If the insertion type is to be random, then in step 300 some or all of the circuit blocks are selected. Next, in step 305, a random distribution of latches and other scan chain elements into the selected circuit blocks is generated and the method proceeds to step 310. If the insertion type is to be weighted, then the method proceeds to step 315.

In step 315 some or all of the circuit blocks are selected. Then in step 320, the weighting type is determined. If in step 320 the weighting type is area then the method proceeds to step 325. In step 325, the amount of chip area of each circuit block is determined and then in step 330, the latches and other circuit elements are distributed proportionally to the selected circuit block areas. Circuit block areas may be determined from the floor plan, or estimated based on the circuit elements within each functional circuit block of the netlist. The method then proceeds to step 310.

Returning to step 320, if in step 320 the weighting type is sensitivity then the method proceeds to step 335. In step 335, each circuit block is assigned a weight based on user defined rules or input and then in step 340, the latches and other circuit elements are distributed proportionally to the selected circuit block weights. The method then proceeds to step 310.

In step 310, the shorts/opens defect monitor circuit latches and other circuits are inserted into the netlist by adding them to the functional and parametric test scan chains (if present in the design). If there are no functional and parametric test scan chains in the design, then the shorts/opens defect monitor circuit latches and other circuits are simply inserted into the netlist as standalone scan chains. The shorts/opens defect monitor circuit latches and other circuits may inserted into the netlist as standalone scan chains even if functional and parametric test scan chains exist.

Figure 5:
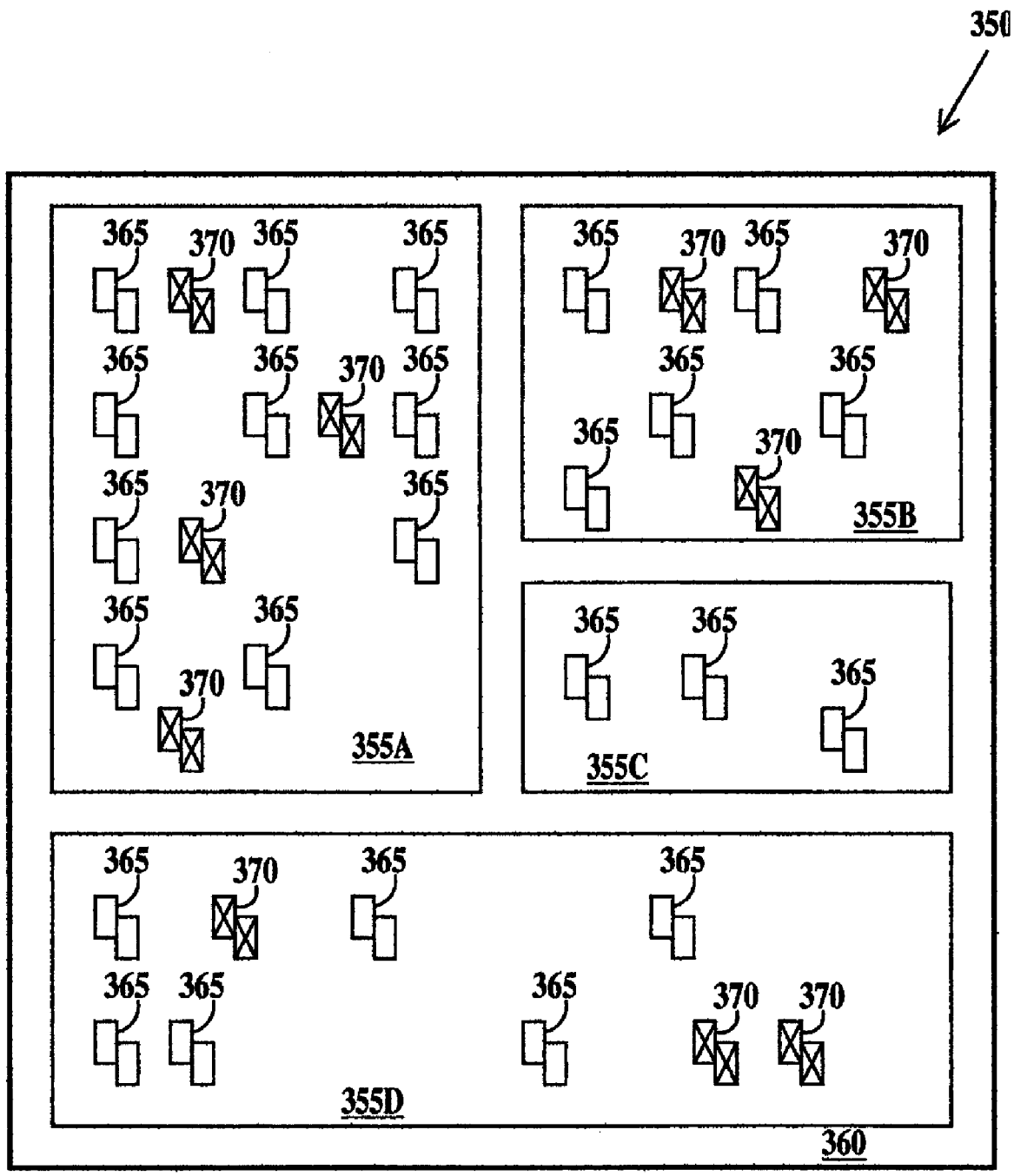
FIG. 5 is a diagram illustrating an exemplary distribution of scan chain latches according to an embodiment of the present invention.

FIG. 5 is a diagram illustrating an exemplary distribution of scan chain latches according to an embodiment of the present invention. In FIG. 5, steps 265 and 275 of FIG. 3 and described supra have been performed. In FIG. 5, an integrated circuit chip 350 includes circuit blocks 355A, 355B, 355C and 355D, and a kerf 360. Circuit blocks 355A, 355B and 355D include functional and parametric test scan chain latches 365 and shorts/opens defect monitor scan chain latches 370. Circuit block 355C includes functional and parametric test scan chain latches 365, but no shorts/opens defect monitor scan chain latches 370.

Figure 6:
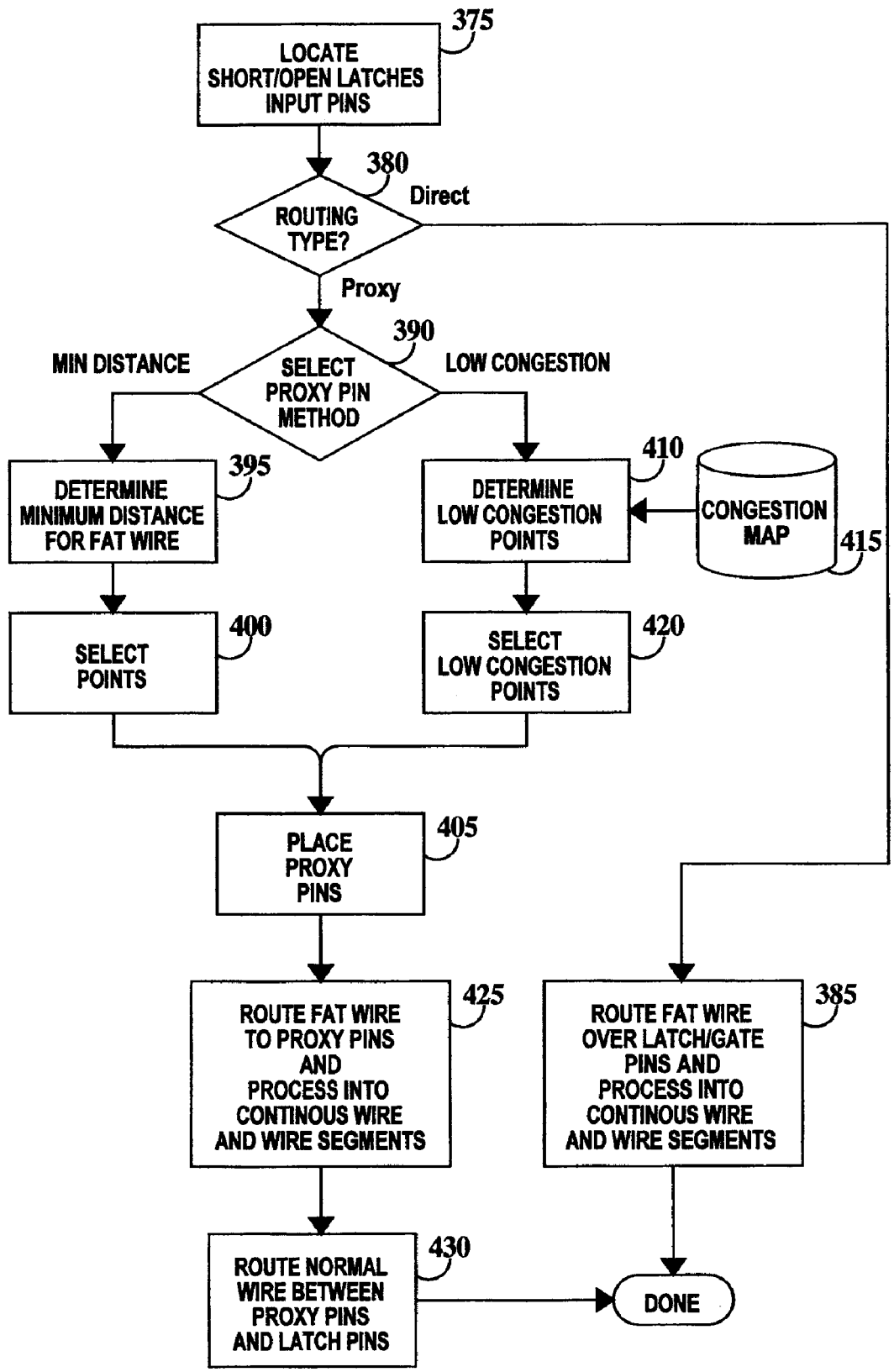
FIG. 6 is a detailed flowchart of step 280 of FIG. 3.
Figure 7:
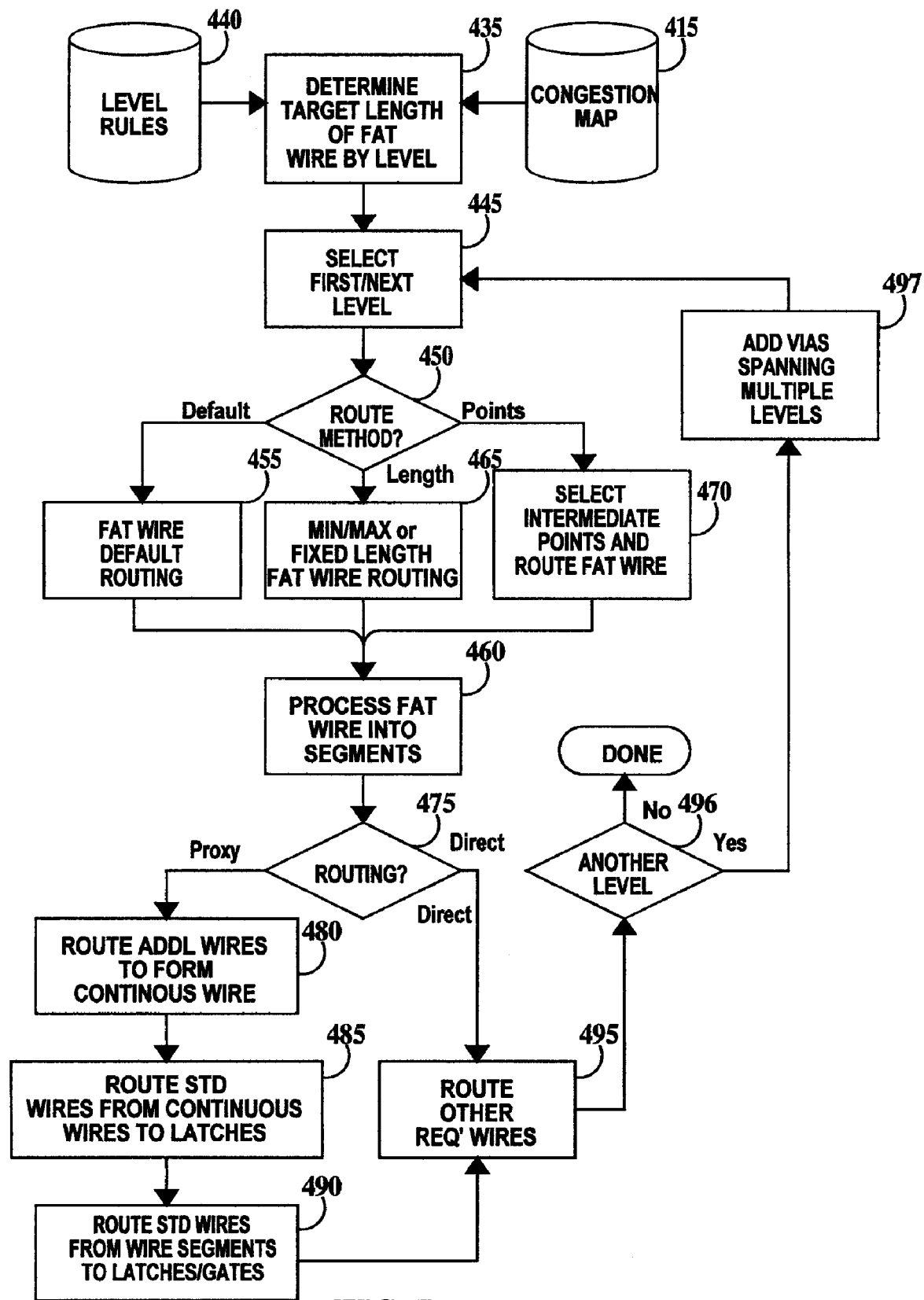
FIG. 7 is a detailed flowchart of steps 385 and 425 of FIG. 6.
Figure 10A:
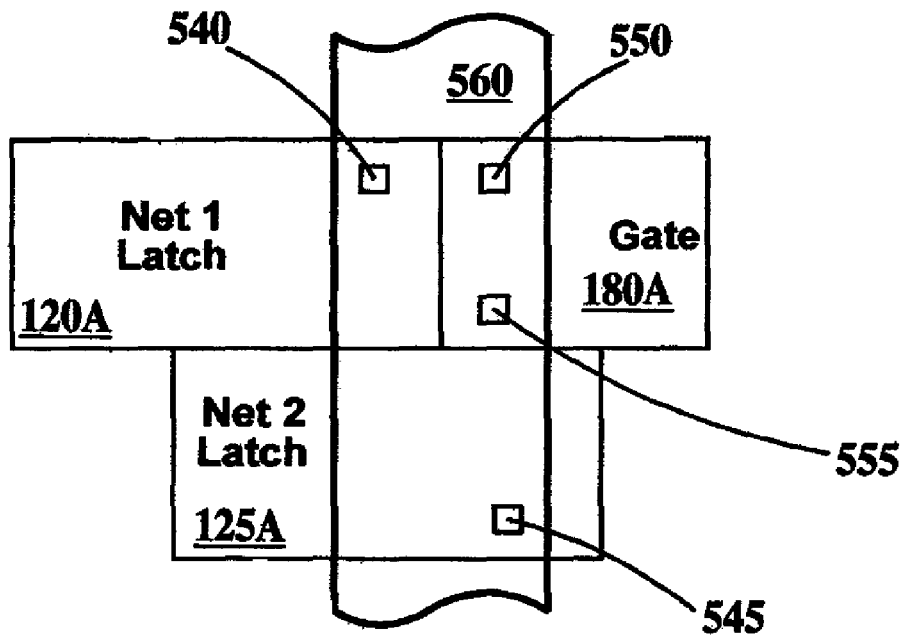
FIGS. 10A and 10B illustrate processing a routed fat wire into wire segments according to another embodiment of the present invention.
Figure 10B:
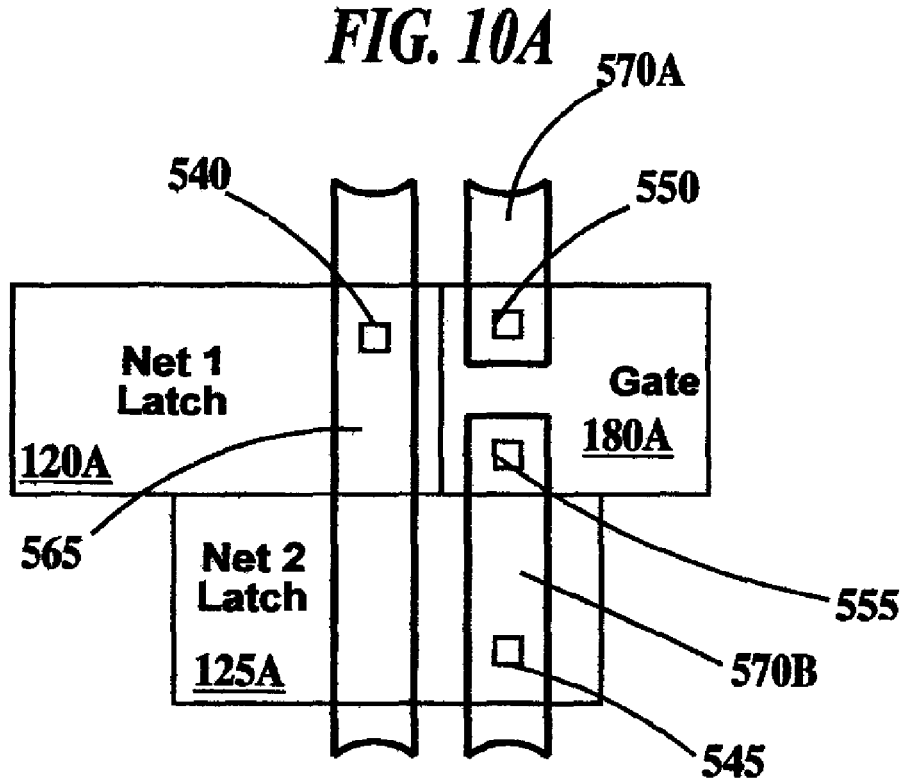

FIG. 6 is a detailed flowchart of step 280 of FIG. 3. In step 375, the physical location of the input pins of the shorts/opens defect monitor scan chain latches are determined. Next, in step 380, the wire routing type is selected. If in step 380, direct routing is selected, then the method proceeds to step 385. In step 385, a fat wire is routed over a pair of one first set and one second set shorts/opens defect monitor scan chain latches and a corresponding transmission gate and the fat wire is then processed into a nominally continuous wire and wire segments. This method requires the pair of one first set and one second set shorts/opens defect monitor scan chain latches and the corresponding transmission gate be close enough so their input pins will be overlaid by the fat wire. (See FIGS. 10A and 10B). A fat wire is defined as wire having a width greater than the minimum wire width groundrule of the wiring level containing the fat wire. Minimum wire widths may be different for different wiring levels. The width of the fat wire used in the present invention should have a minimum value of the minimum wire space (distance between immediately adjacent wires) plus twice the minimum wire width of the wiring level containing the fat wire. Step 385 is illustrated in FIGS. 7, 10A and 10B and described in more detail infra.

Returning to step 380, if in step 380 proxy pin routing is selected the method proceeds to step 390. In step 390 a proxy pin method is selected. Two methods are illustrated in FIG. 6, a minimum distance method and a low congestion method. Other methods may be substituted. If in 390 the minimum distance method is selected, then in step 395, the minimum distance that proxy pins can be placed from the shorts/opens defect monitor latches without shorting out any of their input or output (or clock) pins is determined. Then, in step 400, a required number of points at the minimum distance or further away are selected. The method then proceeds to step 405.

Returning to step 390, if in step 390, the low congestion method is selected the method proceeds to step 410. In step 410, points of lowest congestion in a predetermined region around each shorts/opens defect monitor latch and transmission gate is determined using a congestion map 415. The generation and use of congestion maps is well known in the art. Then in step 420, the required number of these low congestion points are selected and the method proceeds to step 405.

Figure 8A:
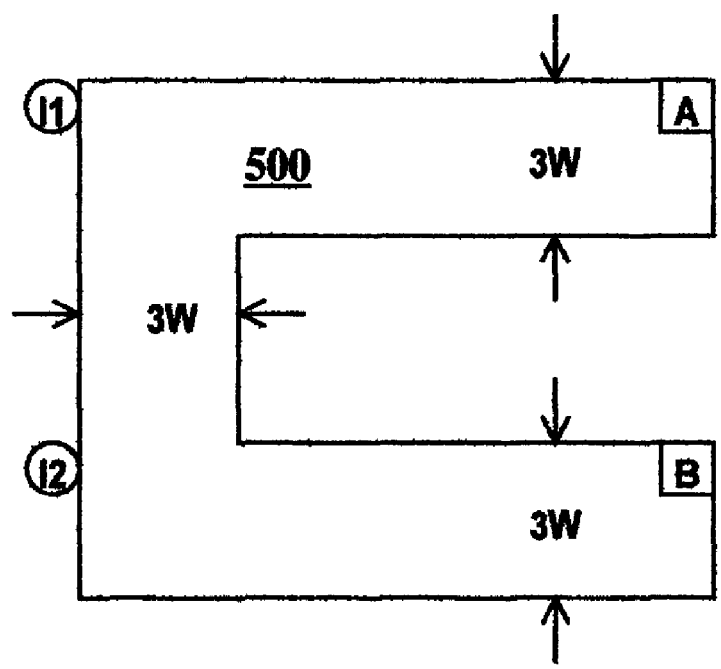
FIGS. 8A and 8B illustrate processing a routed fat wire into wire segments according to an embodiment of the present invention.
Figure 8B:
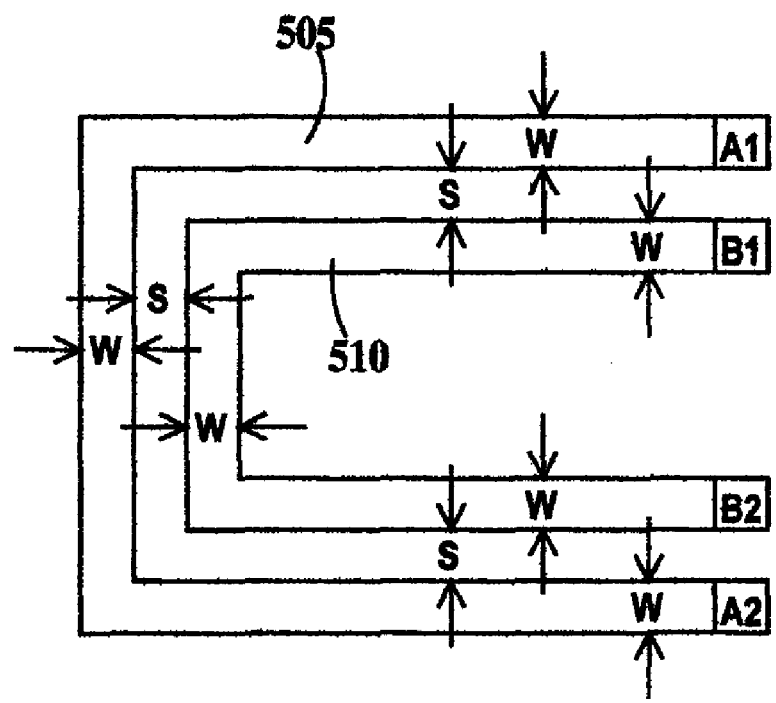
Figure 9:
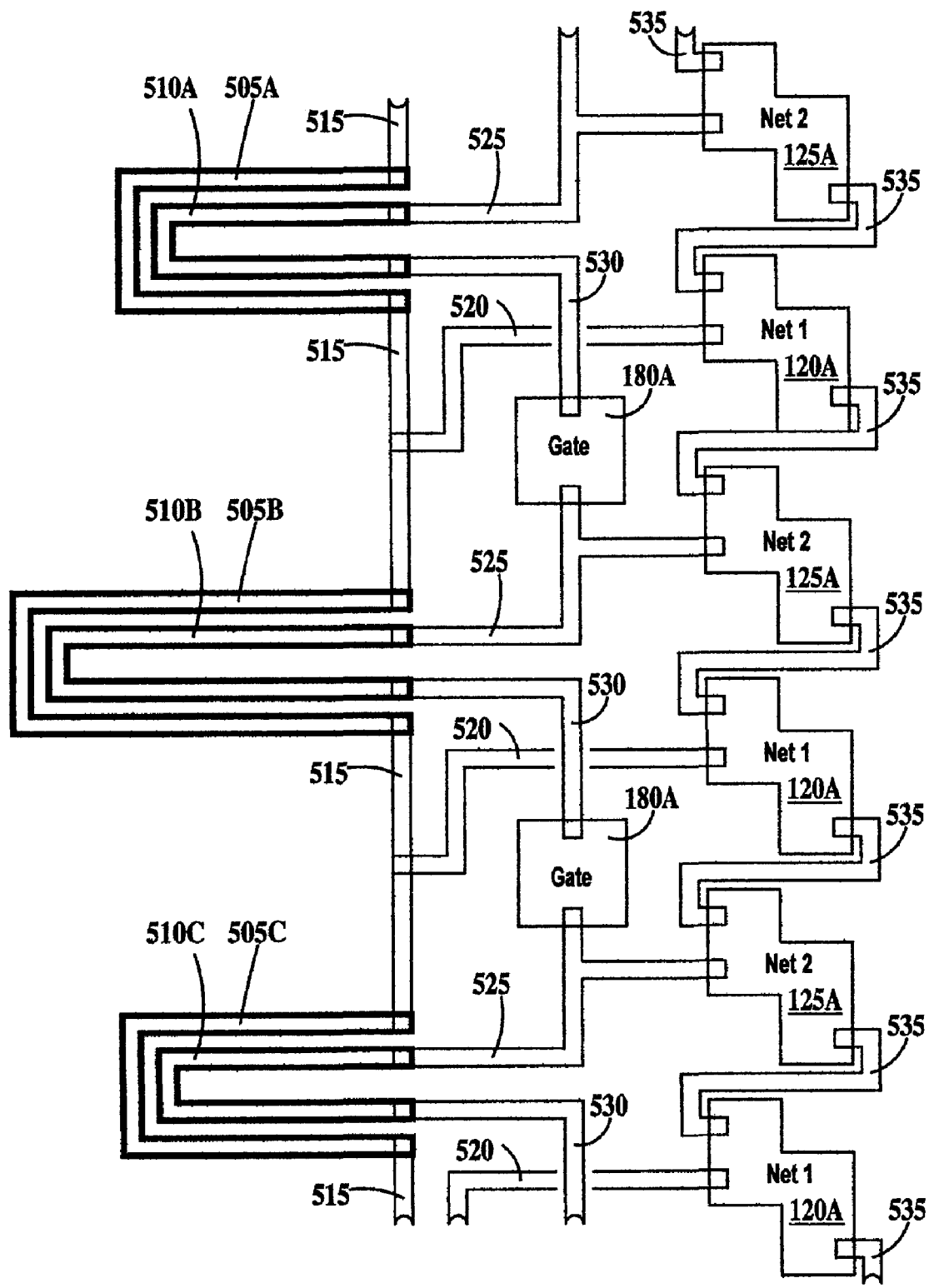
FIG. 9 is a illustration of routing of interconnecting wires to form a shorts/opens defect monitoring structure according to the present invention.

In step 405, proxy pins are placed at the selected points and the method proceeds to step 425. In step 405, a set of fat wires are routed between sets of proxy pins and the fat wire is then processed into a nominally continuous wire (which may or may not be multiple wire segments at this point in the method, see infra) and into wire segments. The physical location of shorts/opens defect monitor scan chain latches and corresponding transmission gates is not constrained. Step 425 is illustrated in FIGS. 7, 8A and 8B and described in more detail infra. Next in step 430, normal wires are routed between the proxy pins and the pins of shorts/opens defect monitor scan chain latches and corresponding transmission gates. The structure generated by step 430 is illustrated in FIG. 9 and described infra.

FIG. 7 is a detailed flowchart of steps 385 and 425 of FIG. 6. In step 435 a target length of fat wire(s) is determined for each wiring level using congestion map 415 and a set of level rules 440. Level rules 440, include minimum/maximum/recommended line widths, line spacing, via size/number/location groundrules and wire routing rules. Vias are used to connect wires in a given level to wires in other levels or contacts to devices in the chip substrate. Then in step 445, the first/next wiring level is selected. (Note steps 435 and 445 may alternatively be performed in reverse order.) In step 450, the wire routing method is selected. Three methods are illustrated in FIG. 7, but any number of other methods may be subsituted.

If in step 450, router default is selected, then in step 455, the fat wire is routed based on router wiring rules for the current wiring level and the method proceeds to step 460. If in step 450, minimum/maximum wire is selected, then in step 465, a fat wire(s) is routed with either a minimum length not generating unwanted connections (shorts) to other pins or the fat wire(s) is routed with a maximum length where there is room in the current wiring level or a pre-determined length and the method then proceeds to step 460.

If in step 450, point routing is selected, then in step 470, intermediate points are selected (see FIG. 8A) and the fat wire is routed between proxy pins (if steps 405, 425 and 430 of FIG. 6 were performed) or shorts/opens defect monitor latch and transmission gate pins (if step 385 of FIG. 6 was performed) through the intermediate points and the method proceeds to step 460. In step 460, the fat wire is processed to parallel wire segments connecting the proxy pins or shorts/opens defect monitor latch and transmission gate input and output pins. Processing a fat wire into parallel wire segments ensures, a uniform spacing for shorts testing and wire width for opens testing along the entire portion of the shorts/opens monitor structure sampled by a given first latch 120 second latch 125 and corresponding transmission gate 180 (see FIG. 1) set.

In step 475, it is determined if intermediate point or direct routing was used for fat wire routing (see FIG. 5, step 380). If routing was by intermediate point, then in step 480, additional wires are routed to certain intermediate points to form the nominally continuous wire. Then in step 485, additional wires are routed from the nominally continuous wire to corresponding pins of the opens/shorts defect monitor latches. Next in step 490, additional wires are routed from the wire segments to corresponding pins of the opens/shorts defect monitor latches and transmission gates. Then in step 495 any other additional wires needed to complete the shorts/open defect monitoring circuit are routed and the method proceeds to step 496. If it is determined in step 460, that routing was by direct routing, then the method proceeds to step 495.

In step 496, it is determined if multiple wiring levels have been routed. If not the method is complete. If the current wiring level is the second or subsequent wiring level then in step 497, vias are between the nominally continuous wire of the current wire level and the nominally continuous wire of the previous wire level plus any vias needed for wiring the current level into the shorts/open defect monitor scan chain. The method then proceeds to step 445.

FIGS. 8A and 8B illustrate processing a routed fat wire into wire segments according to an embodiment of the present invention. FIGS. 8A and 8B illustrate routing a fat wire by intermediate points. In FIG. 8A, a fat wire 500 having a width 3W has been routed between proxy pins A and B located at opposite ends of fat wire 500 via intermediate points I1 and I2. In one example, W is the minimum width allowable for a wire in the wiring level of fat wire 3W. In FIG. 8B, fat wire 500 (see FIG. 8A) has been processed into two parallel wires 505 and 510, wire 505 being outside of wire 510. Proxy pin A has also been processed into proxy pins A1 and A2 positioned at opposite ends of wire 505 and proxy pin B has been processed into proxy pins B1 and B2 positioned at opposite ends of wire 510. Intermediate points I1 and I2 (see FIG. 8A) are removed in FIG. 8B. Continuing the example of FIG. 8A, wires 505 and 510 are W wide and separated by a space S where S=W. Wire 505 will be connected to other wires similar to wire 505 to form a nominally continuous wire of a shorts/opens defect monitor structure, while wire 510 along with other wires similar to wire 510 will be used as the wire segments of the shorts/opens defect monitor structure.

FIG. 9 is a illustration of routing of interconnecting wires to form a shorts/opens defect monitoring circuit and structure according to the present invention. FIG. 9 illustrates interconnecting fat wires routed wires by intermediate points into a shorts/opens defect monitor circuit similar to a portion of shorts/opens defect monitor circuit 100 illustrated in FIG. 1 and described supra. In FIG. 9, wire segments 505A, 505B and 505C have been interconnected in series by routed wires 515 to form a nominally continuous wire. Routed wires 515 have been connected to data input pins of first net latches 120A by routed wires 520. A first end of each wire segment 510A, 510B and 510C has been interconnected to data input pins of each net2 latch 125A and an first pin of a transmission gate 180A by routed wires 525. A second end of each wire segment 510A, 510B and 510C has been interconnected to a second pin of a transmission gate 180A by routed wires 530. The output pin of each net2 latch 125A has been connected to an input pin of one net1 latch 120A by a routed wire 535. It should be understood that wire segments 505A, 505B and 505C need not be the same length or shape, located in proximity to each other, be on the same wiring level or located in proximity to net1 latches 120A, net2 latches 125A or transmission gates 180A. It should be further understood that wire segments 510A, 510B and 510C need not be the same length or shape, located in proximity to each other, be on the same wiring level or located in proximity to net1 latches 120A, net2 latches 125A or transmission gates 180A. It should be still further understood that net1 latches 120A, net2 latches 125A or transmission gates 180A need not be located in proximity to each other and may be in other arrangements other than that illustrated in FIG. 9, one or more latches from functional and parametric test scan chains may be coupled between one or more of net1 latches 120A and net2 latches 125A pairs.

In the present example, routed wires 520 must cross over or under routed wires 530. This may be accomplished by the use of vias (not shown) to and from wires routed in a lower or higher wiring level for this purpose.

FIGS. 10A and 10B illustrate processing a routed fat wire into wire segments according to another embodiment of the present invention. FIGS. 10A and 10B illustrate interconnecting fat wires routed directly over net1 latches 120A, net2 latches 125A and transmission gates 180A. In FIG. 10A, net1 latch 120A has a data input pin 540, net2 latch 125A has a data input pin 545 and transmission gate 180A has a first pin 550 and a second pin 555. A fat wire 560 has been routed over pins 540, 545, 550 and 555. In FIG. 10B, fat wire 560 (see FIG. 10A) has been processed into a continuous wire segment 565 and a first wire segment 570A and a second wire segment 570B. Continuous wire 565 contacts pin 540. Wire segment 570A contacts pin 550. Wire segment 570B contacts pins 545 and 555. In the example of FIGS. 10A and 10B, net1 latch 120A, net2 latch 125A, transmission gate 180A and fat wire 560 are in proximity with one another.

Figure 11A:
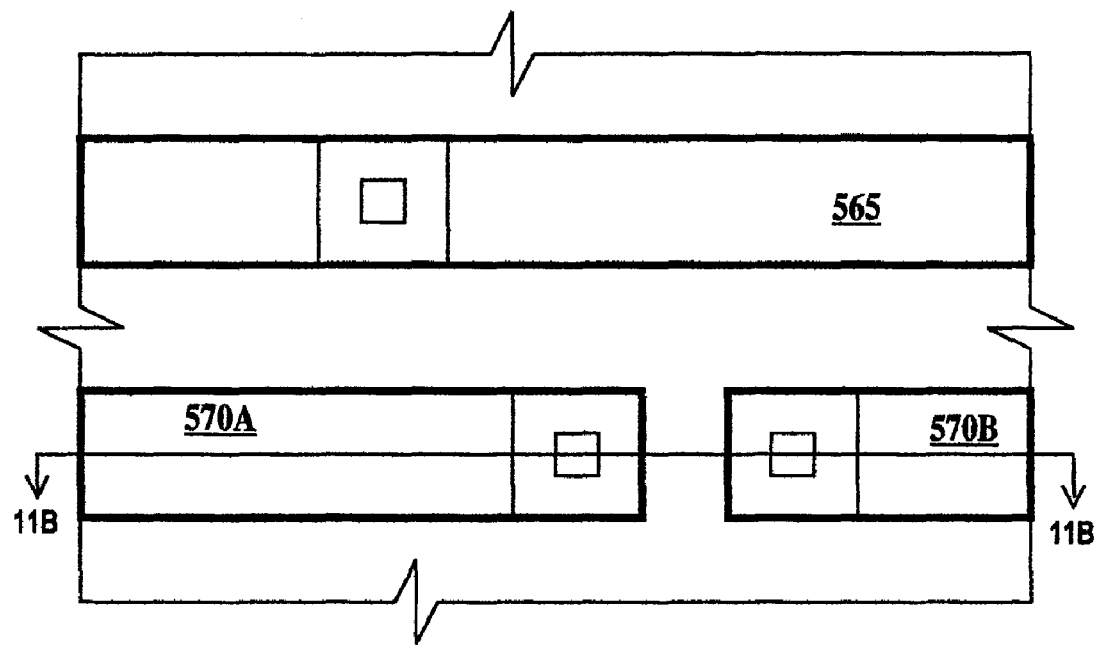
FIG. 11A is a partial view and FIG. 11B is a cross-sectional view through line 11B—11B of FIG. 11A illustrating placement of shorts/opens defect monitor circuit structures in an arbitrary wiring level of an integrated circuit chip.
Figure 11B:
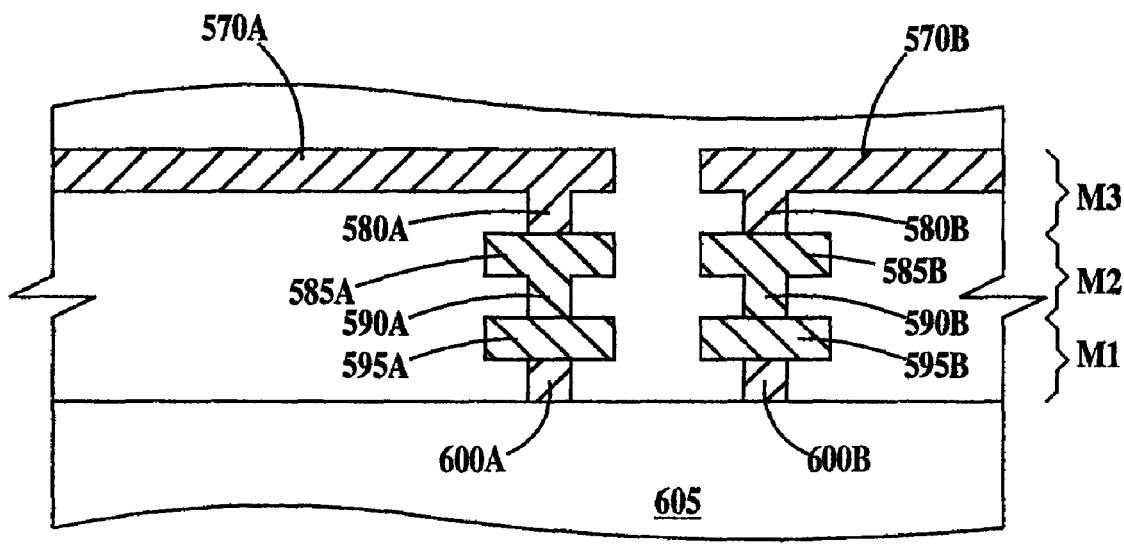

FIG. 11A is a partial view and FIG. 11B is a cross-sectional view through line 11B—11B of FIG. 11A illustrating placement of defect monitor structures in an arbitrary wiring level of an integrated circuit chip. FIGS. 11A and 11B continue the example of FIGS. 10B but should be considered exemplary of the structures designed by any embodiment of the present invention. In FIGS. 11A and 11B continuous wire segment 565 and wire segments 570A and 570B are located in a third wiring level M3 above a first wiring level M1 and a second wiring level M2. A via 580A in wiring level M3 connects wire segment 570A to a wire 585A in wiring level M2. A via 590A in wiring level M2 connects wire segment 585A to a wire 595A in wiring level M1. A stud contact 600A in wiring level M1 connects wire segment 595A to a device in substrate 605. Stud 600A may be considered a physical embodiment of a pin. A via 580B in wiring level M3 connects wire segment 570B to a wire 585B in wiring level M2. A via 590B in wiring level M2 connects wire segment 585B to a wire 595B in wiring level M1. A stud contact 600B in wiring level M1 connects wire segment 595B to a device in substrate 605. Stud 600B may be considered a physical embodiment of a pin.

Figure 12:
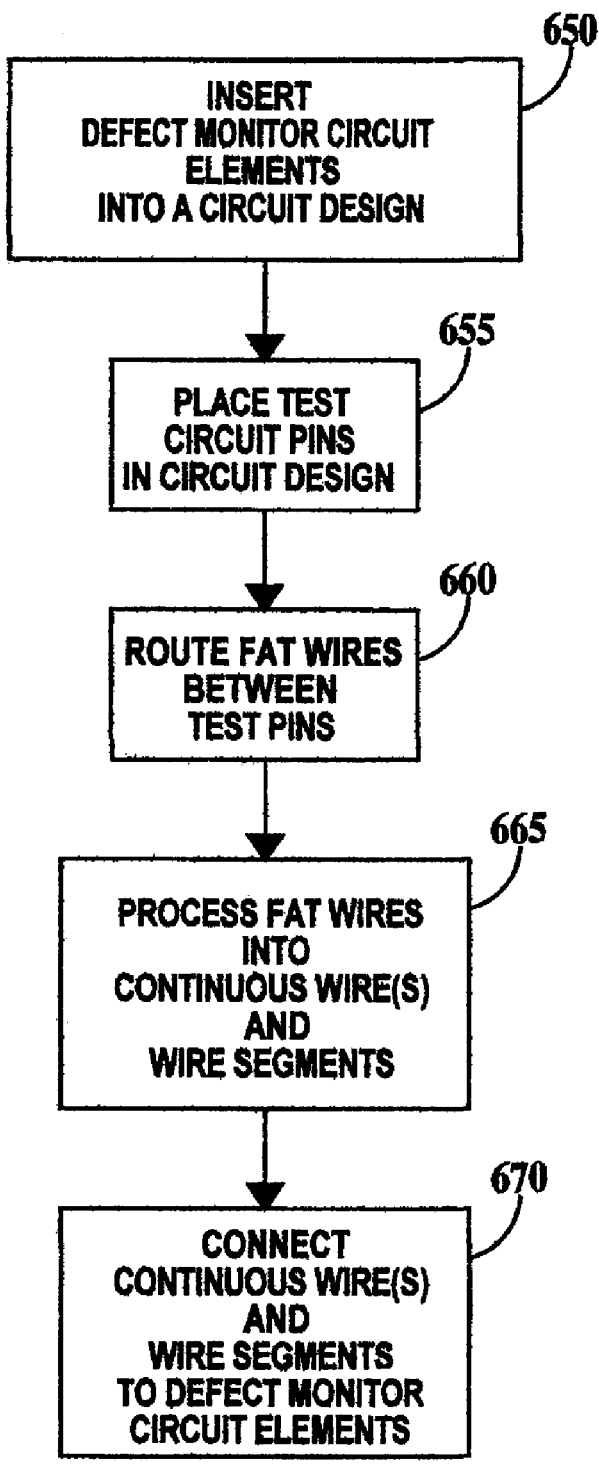
FIG. 12 is a general flowchart of the method of the present invention.

FIG. 12 is a general flowchart of the method of the present invention. FIG. 12 illustrates a method of the present invention that summarizes the methodology illustrated in FIGS. 3, 4, 6, and 7 and described supra. In step 650, defect monitor scan chain elements are inserted into an integrated circuit design. This includes all circuit elements required for a defect monitor scan chain as well as supporting circuit elements (for example pre-charge diodes). In step 655, test circuit pins are placed into the integrated circuit design. In step 660, one or more fat wires are routed between corresponding test circuit pins. In step 665, the fat wire(s) are processed into a continuous wire(s) (which may be comprised of wire segments at this point in the method) and one or more corresponding wire segments for each continuous wire. In step 670, the fat wire(s) and wire segments(s) are connected to the defect monitor circuit elements. This step may include routing wires to interconnect multiple continuous wires into a single continuous wire as described supra and illustrated in FIG. 9.

Figure 13:
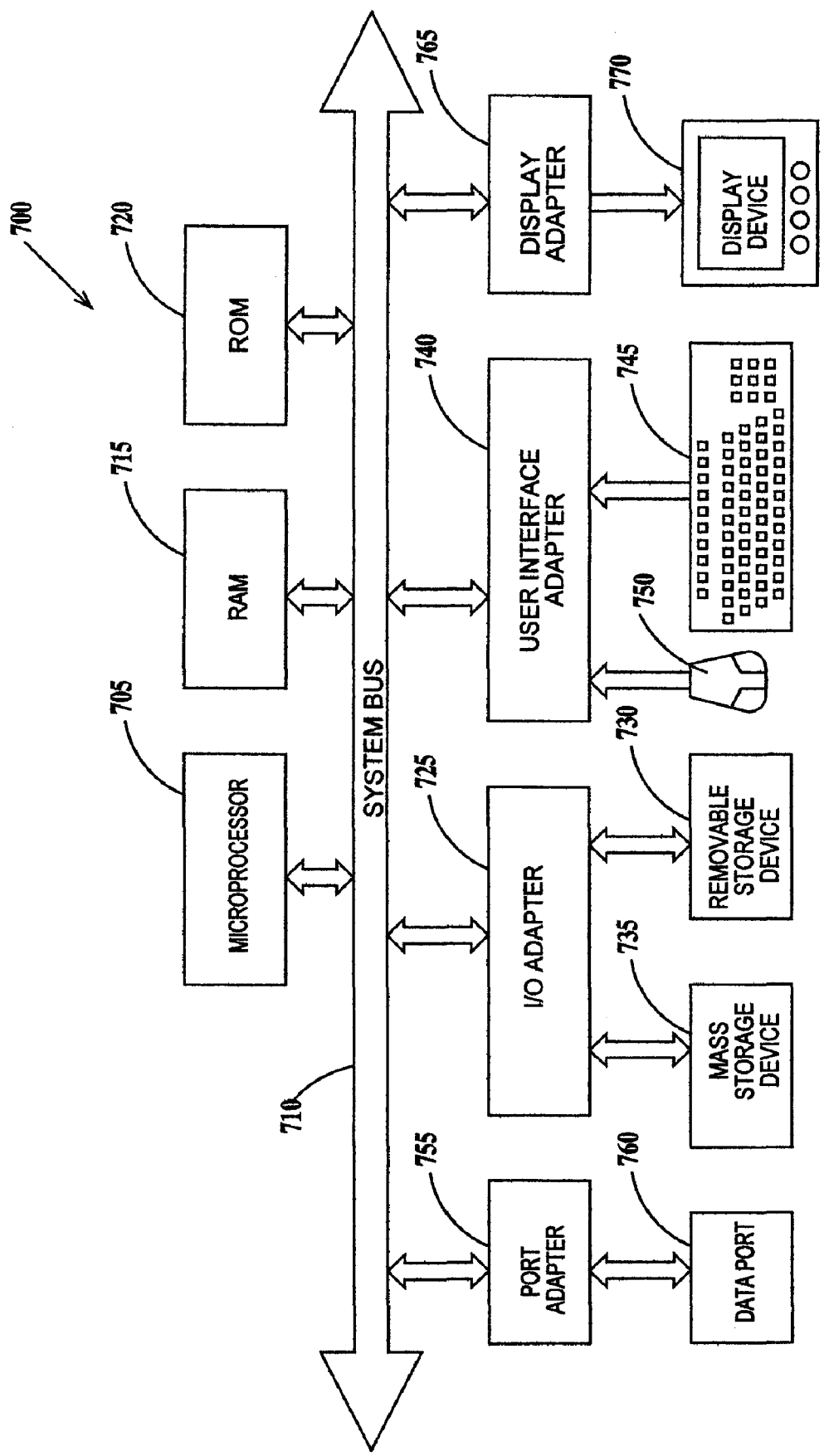
FIG. 13 is a schematic block diagram of a general-purpose computer for practicing the present invention.

Generally, the method described herein with respect to the method of inserting a shorts/opens defect monitor circuit and structure into an integrated circuit design is practiced with a general-purpose computer and the method may be coded as a set of instructions on removable or hard media for use by the general-purpose computer. FIG. 13 is a schematic block diagram of a general-purpose computer for practicing the present invention. In FIG. 13, computer system 700 has at least one microprocessor or central processing unit (CPU) 705. CPU 705 is interconnected via a system bus 710 to a random access memory (RAM) 715, a read-only memory (ROM) 720, an input/output (I/O) adapter 725 for a connecting a removable data and/or program storage device 730 and a mass data and/or program storage device 735, a user interface adapter 740 for connecting a keyboard 745 and a mouse 750, a port adapter 755 for connecting a data port 760 and a display adapter 765 for connecting a display device 770.

ROM 720 contains the basic operating system for computer system 700. The operating system may alternatively reside in RAM 715 or elsewhere as is known in the art. Examples of removable data and/or program storage device 730 include magnetic media such as floppy drives and tape drives and optical media such as CD ROM drives. Examples of mass data and/or program storage device 735 include hard disk drives and non-volatile memory such as flash memory. In addition to keyboard 745 and mouse 750, other user input devices such as trackballs, writing tablets, pressure pads, microphones, light pens and position-sensing screen displays may be connected to user interface 740. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 730, fed through data port 760 or typed in using keyboard 745.

Thus the present invention provides a method and system for inserting defect monitor circuits and shorts/opens defect monitoring structures into integrated circuit designs.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, when fat wires are routed, they may be guard banded (using level routing rules, see FIG. 7) so as to place the fat wire a predetermined distance (the guard band) from functional wires to avoid increased potential for short failures between the shorts/opens defect monitor structure and the functional wires. Therefore, it is intended that the following claims cover all such modifications and changes as fall within the true spirit and scope of the invention.

The invention claimed is:

1. A method of designing a test structure, comprising:
    defining and placing test circuit pins in an integrated circuit design;
    routing one or more fat wires, each fat wire routed between a set of said test circuit pins;
    processing each fat wire into a continuous wire and one or more corresponding wire segments adjacent to said continuous wire, said continuous wire separated from said one or more corresponding wire segments by a space; and
    connecting said continuous wire and said one or more wire segments to circuit elements of a defect monitor scan chain, said circuit elements previously inserted into said integrated circuit design.

2. The method of claim 1, wherein said test circuit pins include pins of said previously inserted circuit elements.

3. The method of claim 1, wherein said test circuit pins include proxy pins placed away from and corresponding to one or more pins of said previously inserted circuit elements.

4. The method of claim 1, further including, when more than one fat wire has been routed, routing additional wires to electrically connect each continuous wire in series.

5. The method of claim 4, wherein two or more fat wires have different widths.

6. The method of claim 1, further including, when more than one fat wire has been routed, routing at least a first fat wire of said one or more fat wires in a first circuit block of said integrated circuit design and routing at least a second fat wire of said one or more fat wires in a second circuit block of said integrated circuit design.

7. The method of claim 1, when more than one fat wire has been routed, routing at least a first fat wire of said one or more fat wires in a first wiring level of said integrated circuit design and routing at least a second fat wire of said one or more fat wires in a second wiring level of said integrated circuit design.

8. The method of claim 1, further including:
    placing at least one intermediate point in said integrated circuit design; and
    said routing of one or more fat wires between sets of two or more of said test circuit pins includes routing at least one of said fat wires to said at least one intermediate point.

9. The method of claim 1, further including:
    connecting said defect monitor scan chain to a functional and parametric test scan chain previously inserted into said integrated circuit design.

10. The method of claim 1, wherein said defect scan chain includes a first set of latches, a second set of latches and gates and the method further including:
    routing first wires between said first set of latches and said continuous wire at locations along the length of said continuous wire located between wire segments;
    routing second wires between said second set of latches and corresponding conductor segments of multiplicity of conductor segments; and
    routing third wires to connect said gates between ends of pairs of said wire segments.

11. A computer system comprising a processor, an address/data bus coupled to said processor, and a computer-readable memory unit coupled to said processor, said memory unit containing instructions that when executed by said processor implement a method for designing a test structure, said method comprising the computer implemented steps of:
    placing test circuit pins in an integrated circuit design;
    routing one or more fat wires, each fat wire routed between a set of said test circuit pins;
    processing each fat wire into a continuous wire and one or more corresponding wire segments adjacent to said continuous wire, said continuous wire separated from said one or more corresponding wire segments by a space; and
    connecting said continuous wire and said one or more wire segments to circuit elements of a defect monitor scan chain, said circuit elements previously inserted into said integrated circuit design.

12. The system of claim 11, wherein said test circuit pins include pins of said previously inserted circuit elements.

13. The system of claim 11, wherein said test circuit pins include proxy pins placed away from and corresponding to one or more pins of said previously inserted circuit elements.

14. The system of claim 11, the method further including, when more than one fat wire has been routed, routing additional wires to electrically connect each continuous wire in series.

15. The system of claim 14, wherein two or more fat wires have different widths.

16. The system of claim 11, further including, when more than one fat wire has been routed, routing at least a first fat wire of said one or more fat wires in a first circuit block of said integrated circuit design and routing at least a second fat wire of said one or more fat wires in a second circuit block of said integrated circuit design.

17. The system of claim 11, when more than one fat wire has been routed, routing at least a first fat wire of said one or more fat wires in a first wiring level of said integrated circuit design and routing at least a second fat wire of said one or more fat wires in a second wiring level of said integrated circuit design.

18. The system of claim 11, the method further including:
   placing at least one intermediate point in said integrated circuit design; and
   said routing of one or more fat wires between sets of two or more of said test circuit pins includes routing at least one of said fat wires to said at least one intermediate point.

19. The system of claim 11, the method further including:
   connecting said defect monitor scan chain to a functional and parametric test scan chain previously inserted into said integrated circuit design.

20. The system of claim 11, wherein said defect scan chain includes a first set of latches, a second set of latches and gates and the method further including:
   routing first wires between said first set of latches and said continuous wire at locations along the length of said continuous wire located between wire segments;
   routing second wires between said second set of latches and corresponding conductor segments of multiplicity of conductor segments; and
   routing third wires to connect said gates between ends of pairs of said wire segments.

* * * * *